United States Patent
Tseng et al.

(10) Patent No.: US 9,257,379 B2
(45) Date of Patent: Feb. 9, 2016

(54) CORELESS PACKAGING SUBSTRATE AND METHOD OF FABRICATING THE SAME

(75) Inventors: Tzyy-Jang Tseng, Taoyuan (TW); Chung-W. Ho, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 200 days.

(21) Appl. No.: 13/417,858

(22) Filed: Mar. 12, 2012

(65) Prior Publication Data

US 2013/0008706 A1    Jan. 10, 2013

(30) Foreign Application Priority Data

Jul. 8, 2011    (TW) ............................... 100124353 A

(51) Int. Cl.
| | | |
|---|---|---|
| *H05K 1/11* | (2006.01) | |
| *H01L 23/498* | (2006.01) | |
| *H01L 21/48* | (2006.01) | |
| *H01L 23/00* | (2006.01) | |

(52) U.S. Cl.
CPC ...... *H01L 23/49822* (2013.01); *H01L 21/4857* (2013.01); *H01L 23/49827* (2013.01); *H01L 23/49816* (2013.01); *H01L 24/16* (2013.01); *H01L 2224/131* (2013.01); *H01L 2224/16225* (2013.01); *H01L 2224/16237* (2013.01); *H01L 2224/32225* (2013.01); *H01L 2224/73204* (2013.01); *H01L 2224/83102* (2013.01); *H01L 2924/15311* (2013.01)

(58) Field of Classification Search
USPC .......... 174/266, 250, 253, 255–259, 261–264
See application file for complete search history.

(56) References Cited

U.S. PATENT DOCUMENTS

| | | | | |
|---|---|---|---|---|
| 7,435,680 | B2 * | 10/2008 | Nakamura et al. ............ | 438/678 |
| 8,357,860 | B2 * | 1/2013 | Kaneko ........................ | 174/262 |
| 2012/0067635 | A1 * | 3/2012 | Nang et al. ................... | 174/260 |

FOREIGN PATENT DOCUMENTS

| | | |
|---|---|---|
| CN | 101315917 | 12/2008 |
| CN | 101826469 | 9/2010 |
| CN | 102054710 | 5/2011 |
| CN | 102054814 | 5/2011 |

* cited by examiner

*Primary Examiner* — Tremesha S Willis
(74) *Attorney, Agent, or Firm* — Mintz Levin Cohn Ferris Glovsky and Popeo, P.C.; Peter F. Corless; Steven M. Jensen

(57) ABSTRACT

A coreless packaging substrate is provided which includes: a circuit buildup structure having at least a dielectric layer, at least a wiring layer and a plurality of conductive elements, a plurality of electrical pads embedded in the lowermost one of the at least a dielectric layer, a plurality of metal bumps formed on the uppermost one of the at least a wiring layer, and a dielectric passivation layer formed on the surface of the uppermost one of the circuit buildup structure and the metal bumps, with the metal bumps exposed from the dielectric passivation layer. The metal bumps each have a metal column portion and a wing portion integrally connected to the metal column portion, such that the bonding force between the metal bumps and a semiconductor chip is enhanced by the entire top surface of the wing portions of the metal bumps being completely exposed.

5 Claims, 6 Drawing Sheets

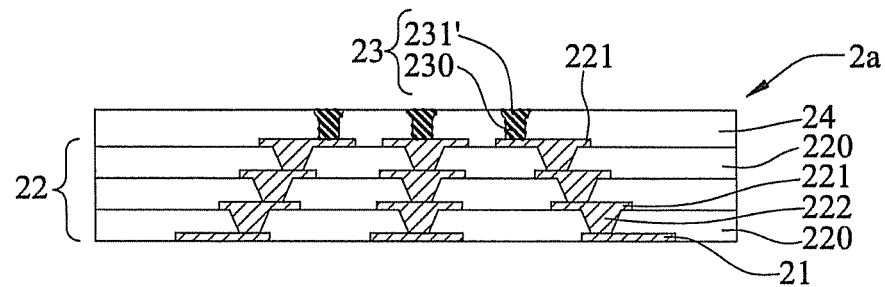
FIG. 3
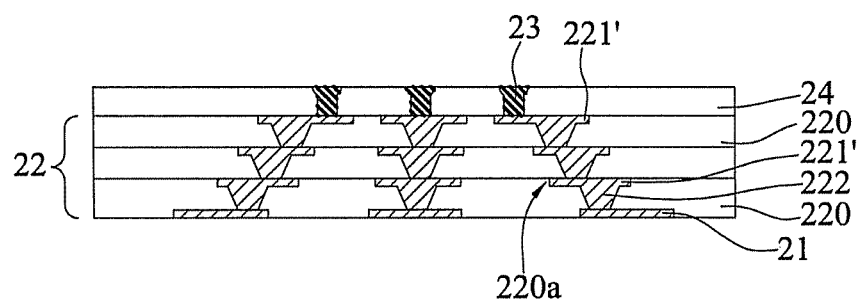
FIG. 3'
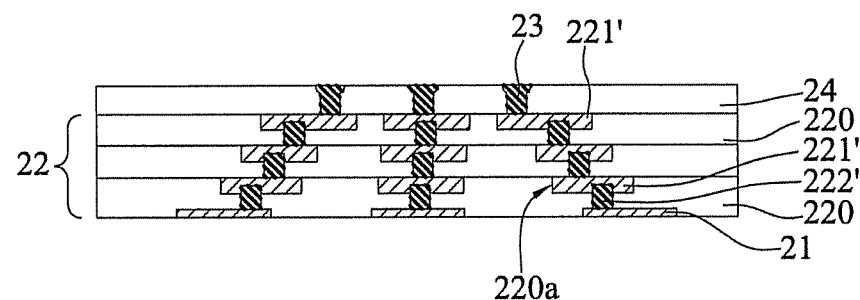
FIG. 3"

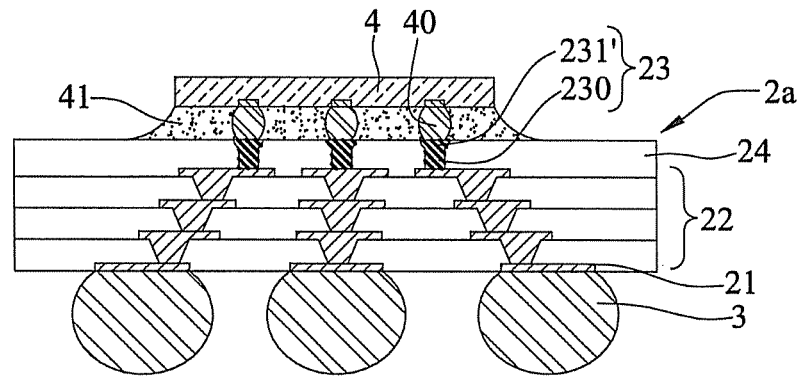
FIG. 4
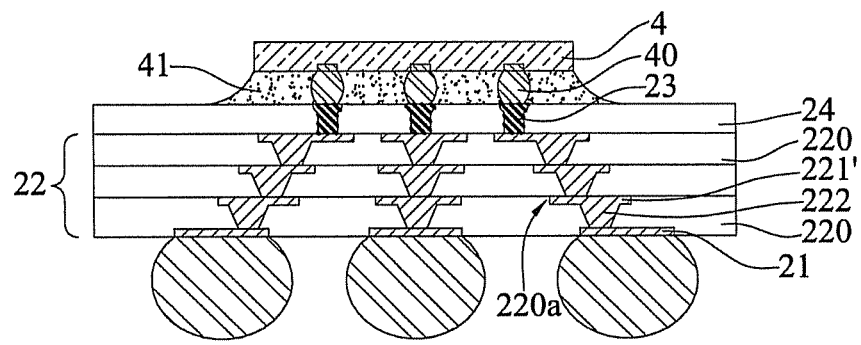
FIG. 4'
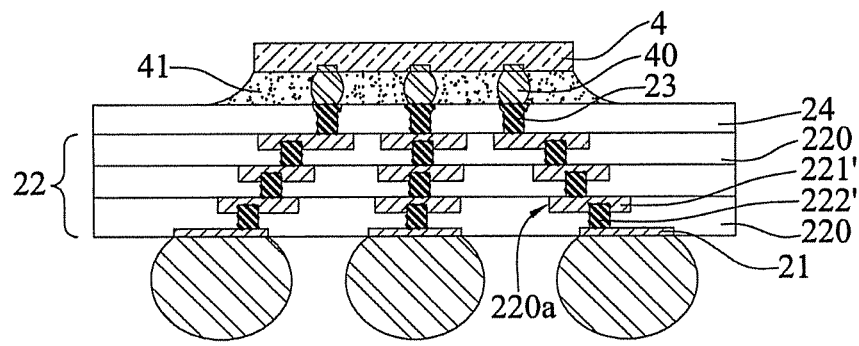
FIG. 4"

CORELESS PACKAGING SUBSTRATE AND METHOD OF FABRICATING THE SAME

CROSS-REFERENCES TO RELATED APPLICATIONS

This application claims under 35 U.S.C. §119(a) the benefit of Taiwanese Application No. 100124353, filed Jul. 8, 2011, the entire contents of which is incorporated herein by reference.

BACKGROUND OF THE INVENTION

1. Field of the Invention

The present invention relates generally to packaging substrates, and, more particularly, to a coreless packaging substrate and a method of fabricating the same.

2. Description of Related Art

With the rapid development of electronic industry, electronic products are trending toward multi-function and high-performance. Currently, the semiconductor package structure has developed various package types such as wire bonding or flip chip that forms a semiconductor chip on a packaging substrate, and the semiconductor chip electrically connects to the packaging substrate by bonding wires or solder bumps. In order to meet the packaging requirements of high integration and miniaturization for semiconductor packages, and to provide a packaging substrate that allows more active and passive components and circuits to be installed and formed thereon, a multi-layer substrate is developed to replace a dual-layer board gradually, so as to use an interlayer connection technique under limited space for enhancing the available layout area on the packaging substrate, such that the requirement of highly integrated circuit can be met with a reduced thickness of the packaging substrate, and that the purpose of improving electrical function is achieved with a compact package structure.

A packaging substrate of the prior art comprises a core board having inner circuits and two circuit buildup structures symmetrically installed on two surfaces of the core board. The use of the core board causes the overall structure to have an increased thickness, which is contradictory to the requirements of increasing performance and reducing sizes.

A packaging substrate that has a coreless structure comes to the market, in order to satisfy the demands of shortened conductive length and reduced structure thickness. As shown in FIG. 1, a method of fabricating a coreless packaging substrate 1 includes forming a first dielectric layer 10 on a carrier board (not shown); forming a first wiring layer 11 having a plurality of first electrical pads 110 on the first dielectric layer 10; forming a circuit buildup structure 12 on the first dielectric layer 10 and the first wiring layer 11, the circuit buildup structure 12 having at least a second dielectric layer 120; forming a second wiring layer 121 on the second dielectric layer 120; electrically connecting the first and second wiring layers 11 and 121 by a plurality of conductive vias 122, the uppermost one of the second wiring layers 121 having a plurality of second electrical pads 123; removing the carrier board to expose the first dielectric layer 10; forming solder masks 14a and 14b on the first dielectric layer 10, the uppermost one of the second dielectric layers 120, and the second wiring layer 121; forming a plurality of openings 140a and 140b on the solder masks 14a and 14b and the first dielectric layer 10 corresponding to the exposed part of the top surface of each of the first and second electrical pads 110 and 123; and forming metal bumps 13a and 13b in the openings 140a and 140b for connecting the solder balls 15a and 15b, such that the upper side solder balls 15b electrically connect the solder bumps (not shown) of the chip and the lower side solder balls 15a electrically connect the circuit board (not shown).

Although it is necessary in the conventional packaging substrate 1 to form the openings 140a and 140b on the solder masks 14a and 14b, the alignment between the solder balls 15a and 15b and the openings 140a and 140b is not easy, thus increasing the difficulty of the process.

Furthermore, the openings 140b of the solder mask 14b only expose a part of the top surface of each of the second electrical pads 123, rather than the entire top surface, so that the area of the top surface of each of the metal bumps 13b is reduced, resulting in weakening of the bonding force between the metal bumps 13b and the chip at the time the chip is installed on the packaging substrate 1, thereby making the chips easily fallen off from the packaging substrate 1 and damaged.

Also, in order to avoid short-circuit resulting from the bridging between the upper side solder balls 15b, and to consider the size of each of the openings 140b of the solder mask 14b for maintaining the bonding force between the metal bumps 13b and the solder mask 14b, the distance between any two neighboring ones of the second electrical pads 123 needs to be increased, so that the spacing between any two neighboring ones of the second electrical pads 123 can not meet fine pitching requirement, resulting in difficulty to improve the layout density of the second electrical pads 123.

Therefore, it is imperative to overcome the above drawbacks of the prior art.

SUMMARY OF THE INVENTION

In view of the above drawbacks of the prior art, the present invention provides a method of fabricating a coreless packaging substrate, including: forming a plurality electrical pads on two opposing surfaces of a circuit board; forming a circuit buildup structure on each of the two surfaces of the carrier board and the electrical pads, the circuit buildup structure having at least a dielectric layer, at least a wiring layer formed on the at least a dielectric layer, and a plurality of conductive elements formed in the dielectric layer and electrically connected to the at least a wiring layer, wherein the electrical pads are embedded in the lowermost one of the at least a dielectric layer, so as for a part of the conductive elements to be electrically connected with the electrical pads; forming a plurality of metal bumps on the uppermost one of the at least a wiring layer; forming a dielectric passivation layer on the uppermost one of the at least a dielectric layer and the uppermost one of the at least a wiring layer for covering the metal bumps; removing a part of the dielectric passivation layer and a part of each of the metal bumps for each of the metal bumps to be formed by a metal column portion and a wing portion integrally connected to the metal column portion, and for an entire top surface of the wing portion of each of the metal bumps to be exposed from the dielectric passivation layer, so as for a semiconductor chip to be electrically connected to the exposed wing portions of the metal bumps; and removing the carrier board for exposing the electrical pads from the lowermost one of the at least a dielectric layer.

In an embodiment of the present invention, the entire top surface of each of the metal bumps is completely exposed from the dielectric passivation layer. Without forming openings on the dielectric passivation layer, alignment problem between the solder balls and the openings in the conventional technique can thus be avoided. And, in that the semiconductor chip is directly mounted onto the metal bump, the process for manufacturing the packaging substrate is simpler than the prior art.

In another embodiment of the present invention, as the entire top surface of each of the metal bumps is completely exposed from the dielectric passivation layer, when compared to the conventional technique, not only the bonding area between the metal bumps and the semiconductor chip but also the bonding force between the metal bump and the semiconductor chip are increased, and thus the chip is not prone to falling off and being damaged.

In the method, since the area of the metal bump is smaller, the distance between the metal bumps can be reduced, such that the distance between the metal bumps can meet the fine pitch requirement, so as to improve the layout density of the metal bumps.

In addition, according to the method of fabricating a coreless packaging substrate, the present invention further provides a coreless packaging substrate.

BRIEF DESCRIPTION OF DRAWINGS

FIG. 3, FIG. 3' and FIG. 3" are schematic cross-sectional views illustrating a coreless packaging substrate according to various embodiments of the present invention; and FIG. 4, FIG. 4' and FIG. 4" are schematic cross-sectional views illustrating subsequent application of a coreless packaging substrate according to various embodiments of the present invention.

DETAILED DESCRIPTION OF PREFERRED EMBODIMENTS

It is to be understood that both the foregoing general descriptions and the following detailed embodiments are exemplary and are, together with the accompanying drawings, intended only to provide further explanation of technical features and advantages of the invention.

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A to 2E are schematic cross-sectional views illustrating a method of fabricating a coreless packaging substrate according to the present invention.

Figure 2A:
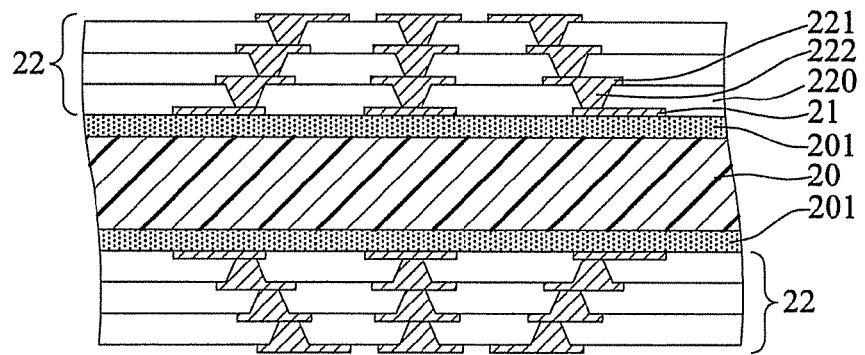
FIGS. 2A to 2E are schematic cross-sectional views illustrating a method of fabricating a coreless packaging substrate according to the present invention, wherein FIG. 2E' is another embodiment of FIG. 2E according to the present invention.

As shown in FIG. 2A, a carrier board 20 having two opposing surfaces is provided, and a plurality of electrical pads 21 are formed on the two surfaces of the carrier board 20.

A circuit buildup structure 22 is formed on the carrier board 20 and the electrical pads 21. The circuit buildup structure 22 has at least a dielectric layer 220, at least a wiring layer 221 formed on the dielectric layer 220, and a plurality of conductive elements (conductive vias 222 are schematically depicted herein) formed in the dielectric layer 220 and electrically connected to the wiring layer 221. The electrical pads 21 are embedded in a lowermost one of the at least a dielectric layer 220, and the conductive vias 222 in the lowermost one of the at least a dielectric layer 220 are electrically connected to the electrical pads 21.

In the embodiment, a release layer 201 is formed on the two opposing surfaces of the carrier board 20, so as for the electrical pads 21 and the lowermost one of the at least a dielectric layer 220 to be laminated on the release layer 201. In addition, a copper layer can be formed on the release layer 201 to form the first electrical pad 21 by plating.

Figure 2B:
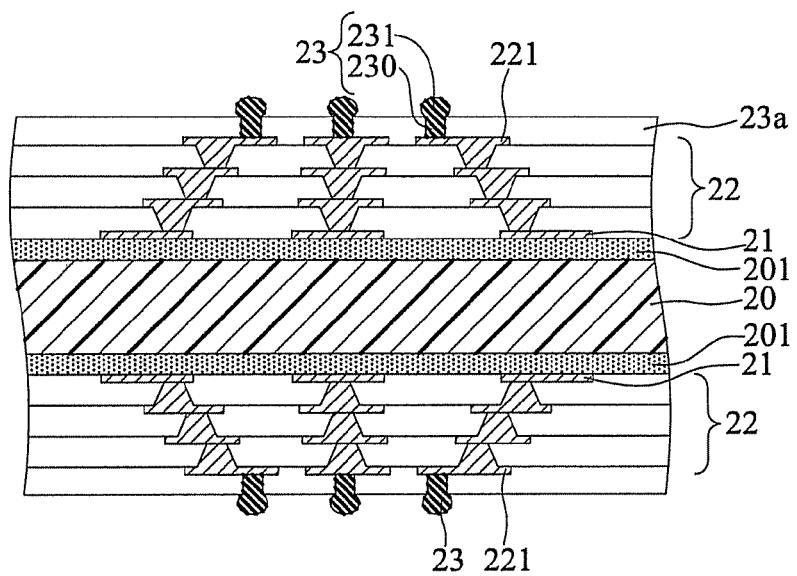

As shown in FIG. 2B, the plurality of metal bumps 23 having a metal column portion 230 and a mushroom-like portion 231 formed on the metal column portion 230 are formed on the uppermost one of the at least a wiring layer 221 in the open area of the resistance layer 23a, by a patterning process on the circuit buildup structure 22.

The plurality of metal bumps 23 are made of copper, nickel, tin, gold, silver or copper-tin alloy. The plurality of metal bumps 23 may be formed by a patterning process, such as additive, semi-additive, subtractive, electroplating, electroless plating deposition, chemical deposition or printing. However, a wide variety of methods and materials for forming the mushroom-like metal bumps may be used, and are not limited to those described herein.

Figure 2C:
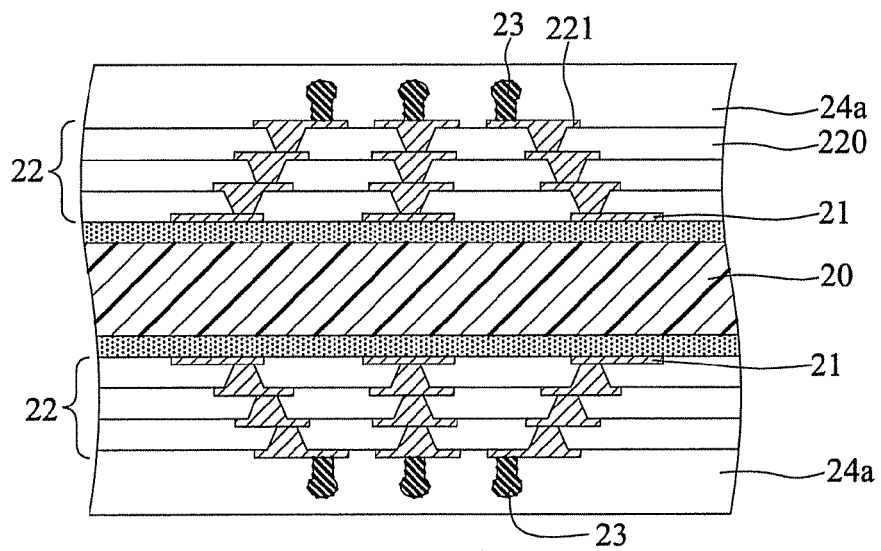

As shown in FIG. 2C, the resistance layer 23a is removed, and the dielectric passivation layer 24a is formed on the uppermost one of the at least a dielectric layer 220 and the uppermost one of the at least a wiring layer 221 for coating the plurality of metal bumps 23.

Figure 2D:
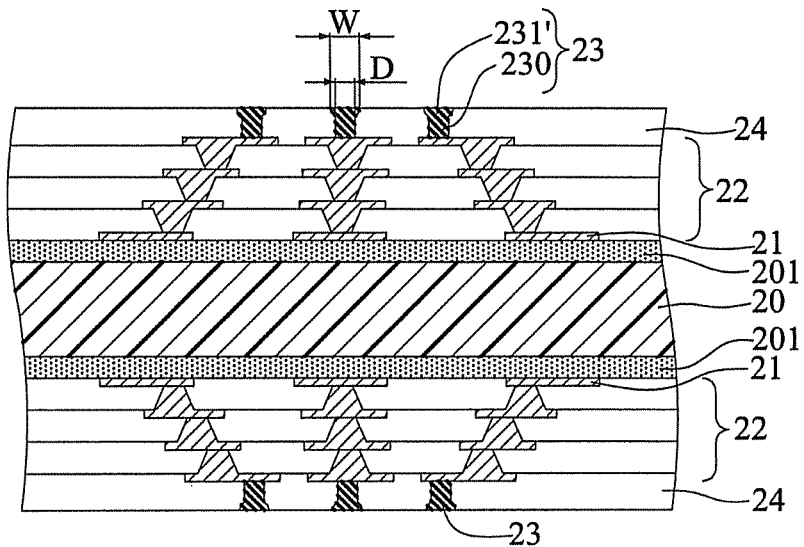

As shown in FIG. 2D, a part of the dielectric passivation layer 24a and a part of the mushroom-like structure 231 are removed by a leveling process, such as grinding, mechanical grinding, or CMP (Chemical Mechanical Polishing), etc., so that the mushroom-like portions 231 are formed into a wing portion 231' and thus exposed. In the embodiment, the surface of the wing portion 231' of the plurality of metal bumps 23 is even with the surface of the dielectric passivation layer 24, and the width W of the wing portion 231' is greater than the diameter D of the end of the metal column portion 230.

Figure 2E:
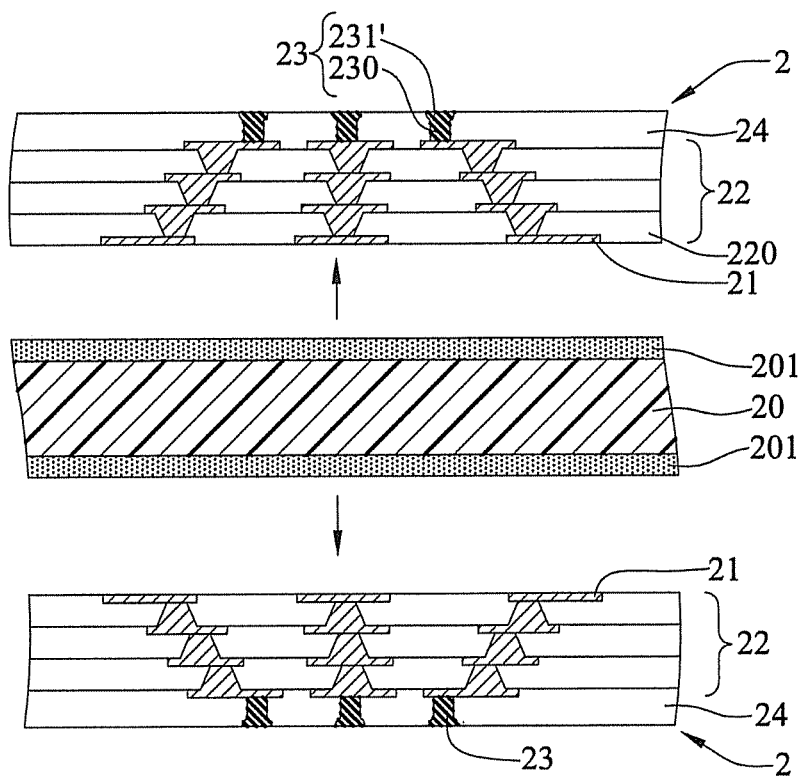
Figure 2E:
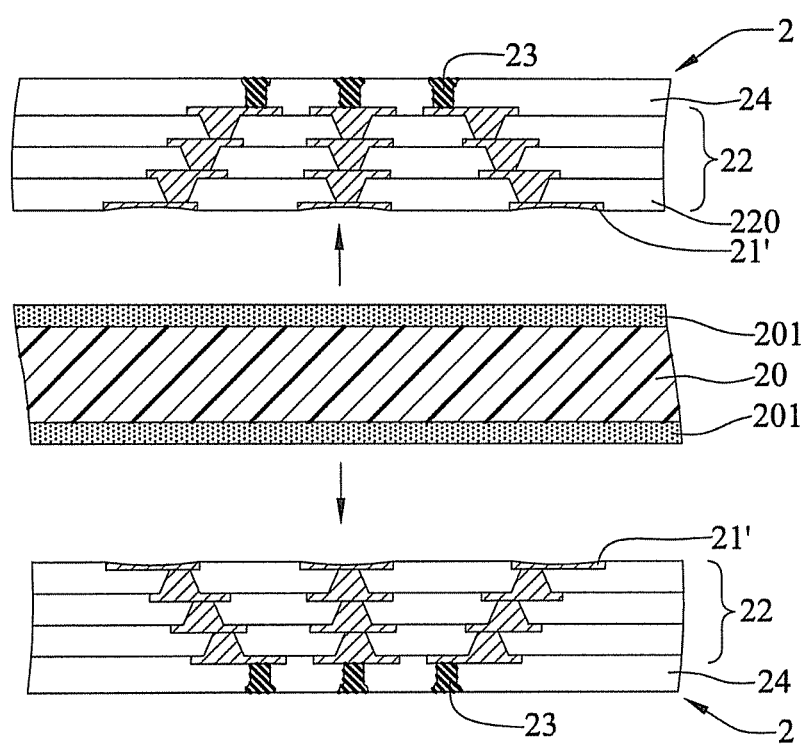

As shown in FIG. 2E, the carrier board 20 is removed by separating the release layer 201, so that the electrical pads 21 are exposed from the surface of the lowermost one of the at least a dielectric layer 220, in order to produce the coreless packaging substrate 2 of the present invention.

As shown in FIG. 2E', in case that the copper layer is formed on the release layer 201, the copper layer has to be removed by etching after the carrier board 20 is removed. Accordingly, the electrical pads 21' are slightly concave at the surface of the lowermost one of the at least a dielectric layer 220.

As shown in FIGS. 3 and 4, a single packaging substrate 2a is obtained by a singulation process, and the semiconductor chip 4 is a flip-chip mounted on the exposed surface of the wing portion 231' of the plurality of metal bumps 23 by the solder bumps 40, and the underfill material 41 is filled between the semiconductor chip 4 and the dielectric passivation layer 24 for coating the solder bumps 40, and the solder ball 3 and the conductive element of a pin may be combined on the exposed surface of the electrical pad 21 for connecting to an electronic device (not shown), such as a circuit board or a package structure.

Also, FIG. 3', FIG. 3", FIG. 4' and FIG. 4" are another processes of FIG. 2A. As shown in FIG. 3', a wiring groove 220a is formed in the dielectric layer 220, by laser burning or plasma etching, during the production of the circuit buildup structure 22, so as to form the wiring layer 221' in the wiring groove 220a. Further, the conductive vias 222 are formed, in order to form the embedded wiring layer 221'. Alternatively, as shown in FIG. 3", the conductive elements are the conductive columns 222' for electrically connecting each of the at least a wiring layer 221' and the first electrical pads 21, and the at least a wiring layer 221' and the conductive columns 222' are produced separately.

In FIGS. 3' and 3", another process of the wiring groove 220a is used to form polymer films (not shown) on the dielectric layer 220. The thin film may be made of a polymer material with a liquid or solid state. The film and the dielectric layer 220 are penetrated by laser ablation to form the wiring groove 220a, and the polarity strength of the surface of the wiring groove 220a is enhanced by plasma. Then, an active layer (not shown) is formed on the pore wall of the wiring groove 220a by a dipping method, in which the dielectric layer 220 is immersed in the chemical solution containing metal particles, so that the metal particles may work as the active layer and be attached onto the pore wall of the wiring groove 220a. Finally, the polymer film is removed by stripping, grinding or chemical etching, while the metal particles on the pore wall of the wiring groove 220a are retained, so that the wiring layer 221' is formed on the active layer in the wiring groove 220a. The materials for forming the active layer may be palladium, platinum, gold or silver, and palladium material can come from a tin palladium chloride colloid or a sulfuric acid chelator.

Figure 1:
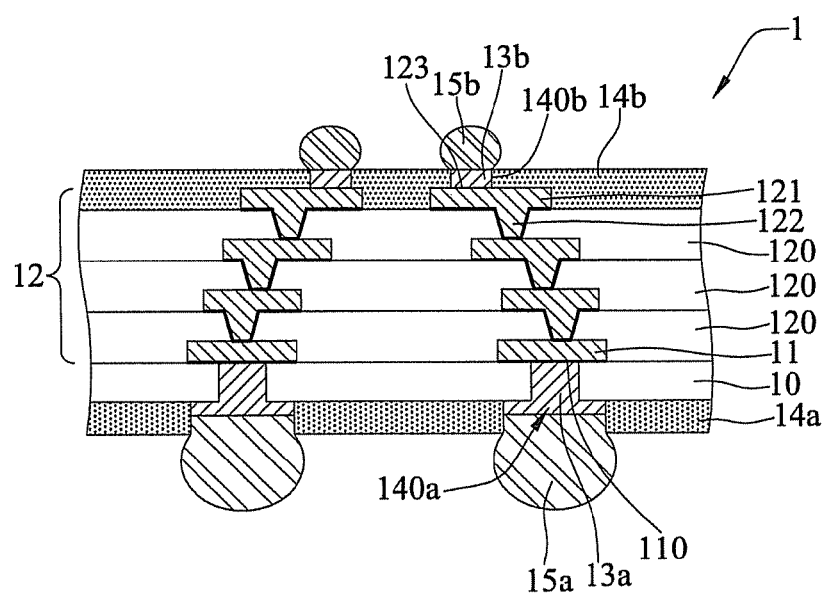
FIG. 1 is a schematic cross-sectional view illustrating a conventional coreless packaging substrate.

The method of fabricating a coreless packaging substrate according to the present invention includes completely exposing the entire top surface of the metal bump 23 from the dielectric passivation layer 24 by a leveling process, so that forming openings on the solder mask as the conventional technique can be avoided. Hence, the solder bumps 40 of the semiconductor chip 4 are directly placed onto the metal bumps, without aligning the semiconductor chip 4 in correspondence to the openings. Forming the solder ball 15b as shown in FIG. 1 on the plurality of metal bumps 23 is thus no more necessary, which makes the process simpler.

Furthermore, the entire top surface of the plurality of metal bumps 23 is completely exposed from the dielectric passivation layer 24, such that not only the bonding area between the plurality of metal bumps 23 and the solder bumps 40 but also the bonding force between the plurality of metal bumps 23 and the solder bumps 40 are increased, and the semiconductor chip 4 is thus not prone to be fallen off and damaged.

Also, since the area of the plurality of metal bumps 23 is smaller, the distance between the plurality of metal bumps 23 can be reduced. Therefore, the distance between the plurality of metal bumps 23 can meet the fine pitch requirement, so as to improve the layout density of the plurality of metal bumps 23.

The present invention further provides a coreless packaging substrate 2a, comprising: a circuit buildup structure 22, a plurality of electrical pads 21 formed below the circuit buildup structure 22, a plurality of metal bumps 23 formed above the circuit buildup structure 22, and a dielectric passivation layer 24 formed above the circuit buildup structure 22 and the plurality of metal bumps 23.

The circuit buildup structure 22 includes at least a dielectric layer 220, at least a wiring layer 221 formed on the dielectric layer 220, and a plurality of conductive vias 222 formed in the dielectric layer 220 and electrically connected to the wiring layer 221. In an embodiment, the wiring layer 221' may be embedded in the dielectric layer 220, as shown in FIG. 3'. In another embodiment, the conductive via 222 is replaced with the conductive column 222' for electrically connecting each of the at least a wiring layer 221', as shown in FIG. 3".

The electrical pads are embedded in the lowermost one of the at least a dielectric layer 220 for electrically connecting a part of the conductive vias 222 or a conductive column portion 222', and the electrical pads 21 are exposed from the surface of the lowermost one of the at least a dielectric layer 220. The exposed surface of the electrical pads 21 are level with the surface of the lowermost one of the at least a dielectric layer 220, or the electrical pad 21' can be slightly concave at the surface of the lowermost one of the at least a dielectric layer 220.

The plurality of metal bumps 23 are formed on the uppermost one of the at least a wiring layer 221, and have a metal column portion 230 and a wing portion 231' formed on the metal column portion 230.

The dielectric passivation layer 24 is formed on the uppermost one of the at least a dielectric layer 220, the uppermost one of the at least a wiring layer 221 and the plurality of metal bumps 23, and is exposed on the entire top surface of the wing portion of the plurality of metal bumps 23, so as to electrically connect the exposed surface of the plurality of metal bumps 23 with the semiconductor chip 4. The surface of the plurality of metal bumps 23 is even with the surface of the dielectric passivation layer 24.

Therefore, in the coreless packaging substrate and the method of fabricating the same according to the present invention, the conventional solder mask is replaced with the dielectric passivation layer, such that the dielectric passivation layer may expose the entire top surface of the metal bumps without an opening, in order to simplify the subsequent process to connect the semiconductor chip.

Furthermore, the entire top surface of the metal bumps is completely exposed from the dielectric passivation layer, the bonding force of the metal bumps may be increased, and thus the semiconductor chip is not prone to be fallen off and damaged.

Also, the entire top surface of the metal bumps is completely exposed from the dielectric passivation layer, so that the distance between the plurality of metal bumps 23 can meet the fine pitch requirement, so as to improve the layout density of the electrical pads.

The above embodiments are illustrated to disclose the preferred implementation according to the present invention but not intended to limit the scope of the present invention. Accordingly, all modifications and variations completed by those having ordinary skill in the art should fall within the scope of present invention defined by the appended claims.

What is claimed is:

1. A coreless packaging substrate, comprising:
a circuit buildup structure having at least a dielectric layer, at least a wiring layer formed on the at least a dielectric layer, and a plurality of conductive elements formed in the dielectric layer and electrically connected to the at least a wiring layer;
a plurality of electrical pads embedded in a lowermost one of the at least a dielectric layer for electrically connecting part of the conductive elements, wherein the electrical pads are exposed from a surface of the lowermost one of the at least a dielectric layer;
a plurality of copper bumps formed on an uppermost one of the at least a wiring layer, and each having a copper column portion and a copper wing portion integrally formed on the copper column portion, wherein the copper wing portion of each of the copper bumps is greater in diameter than the copper column portion; and
a dielectric passivation layer formed on an uppermost one of the at least a dielectric layer, the uppermost one of the at least a wiring layer, and the copper bumps, with an entire top surface of the copper wing portion of each of the copper bumps exposed from the dielectric passivation layer, wherein the exposed top surface of the copper wing portion of each of the copper bumps directly contacts and is electrically connected with solder bumps of a semiconductor chip, the dielectric passivation layer is the same in width as the uppermost one of the at least a dielectric layer, and the copper bumps are free from protruding from the dielectric passivation layer.

2. The coreless packaging substrate of claim 1, wherein the at least a wiring layer is embedded in the at least a dielectric layer.

3. The coreless packaging substrate of claim 1, wherein the conductive elements are conductive vias or conductive columns.

4. The coreless packaging substrate of claim 1, wherein exposed surfaces of the electrical pads are level with or lower than a surface of the lowermost one of the at least a dielectric layer.

5. The coreless packaging substrate of claim 1, wherein the exposed top surface of the copper wing portion of each of the copper bumps is even with a surface of the dielectric passivation layer.

* * * * *